United States Patent [19]
Walden et al.

[11] Patent Number: 5,841,382
[45] Date of Patent: Nov. 24, 1998

[54] FAST TESTING OF D/A CONVERTERS

[75] Inventors: Robert W. Walden, Bethlehem; Ramin Khoini-Poorfard, Allentown; William E. Burchanowski, Bethlehem, all of Pa.

[73] Assignee: Lucent Technologies Inc., Murray Hill, N.J.

[21] Appl. No.: 820,819

[22] Filed: Mar. 19, 1997

[51] Int. Cl.$^6$ ........................................................ H03M 1/10
[52] U.S. Cl. .......................................... 341/120; 341/144
[58] Field of Search .................................. 341/120, 118, 341/144

[56] References Cited

U.S. PATENT DOCUMENTS

| | | | |
|---|---|---|---|
| 3,349,195 | 10/1967 | Gray | 341/120 |
| 3,918,046 | 11/1975 | Rivers | 341/144 |
| 4,266,292 | 5/1981 | Regan et al. | 370/13 |
| 4,641,246 | 2/1987 | Halbert et al. | 364/487 |
| 5,162,744 | 11/1992 | Koozer | 324/618 |

Primary Examiner—Marc S. Hoff

[57] ABSTRACT

Testing of digital-to-analog converters is accelerated by applying one or more different approaches. One approach relies on a switched capacitor, which lowers the overall capacitance of the converter during testing, thereby reducing the settling time for each code value. Another approach makes the duration of each testing step a function of the particular code value, rather than using the worst-case settling time for each testing step. Yet another approach uses a sequence of non-consecutive code values to determine whether each switch in the converter is functional. Using non-consecutive code values permits the use of partial settling times during converter testing. Each of the approaches can be used to accelerate the testing of D/A converters, whether they have linear or folded resistor strings.

17 Claims, 4 Drawing Sheets

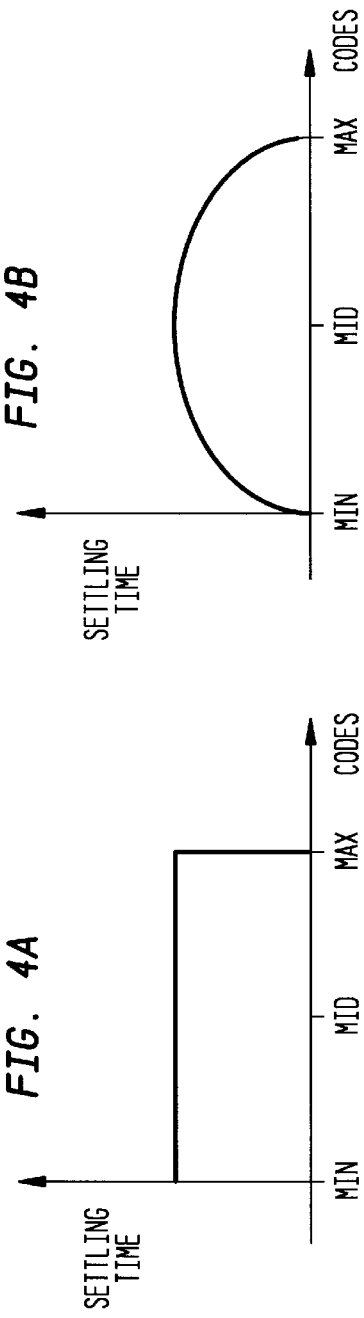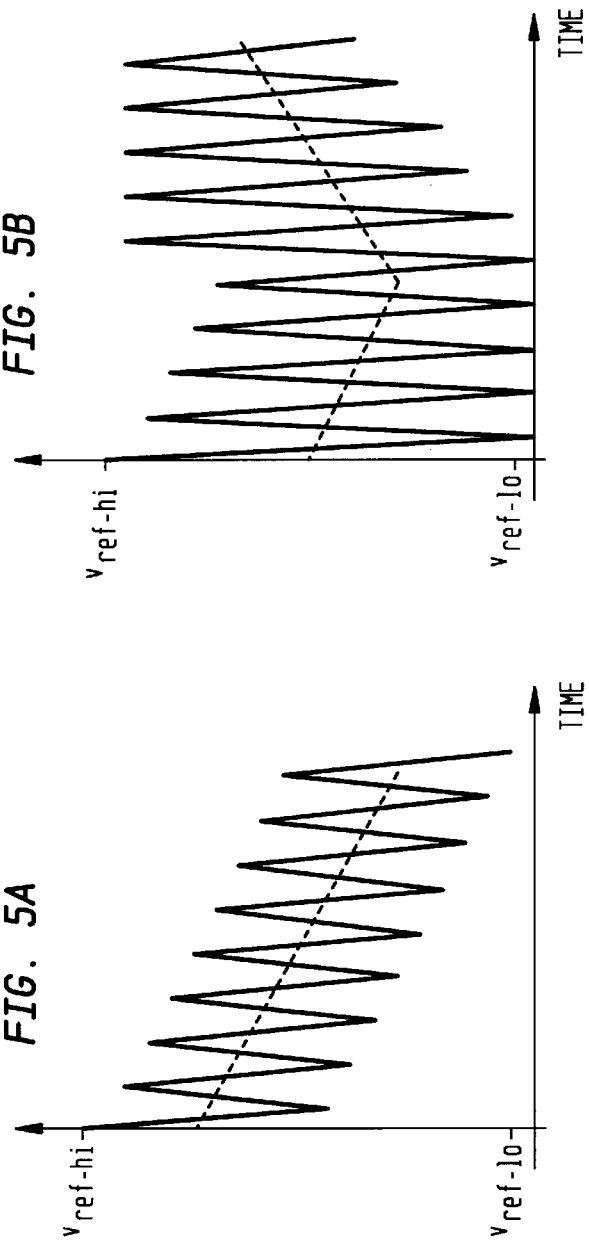

FAST TESTING OF D/A CONVERTERS

BACKGROUND OF THE INVENTION

1. Field of the Invention

The present invention relates to digital-to-analog converters, and, in particular, to methods for testing such converters for proper functionality.

2. Description of the Related Art

FIG. 1 shows a schematic diagram of a conventional linear-resistor-string digital-to-analog (D/A) converter 100. D/A converter 100 has $2^N$ resistors R and $2^N$ switches SWi arranged in a resistive ladder, where N is the resolution of D/A converter 100. The switches SWi may be implemented using metal oxide semiconductor (MOS) transistors, such as NMOS, PMOS, or CMOS transistors. In operation, reference voltages $V_{ref-hi}$ and $V_{ref-lo}$ are applied to the ends of the resistive ladder, and the analog output signal $V_{out}$ is generated at the output of unity gain buffer amplifier 102. Decoder 104 controls the switches SWi based on a received code value (i.e., an N-bit digital input value $B=(b_1, \ldots, b_N)$), such that only one switch is turned on at any given time. A different switch of the resistive ladder is turned on for each different possible code value B. For example, when the code value B corresponds to the decimal value 0, switch $SW2^N$ is turned on. Similarly, when the code value B corresponds to the decimal value $(2^N-1)$, switch SW1 is turned on. In this way, the resistive ladder is used as an incrementally variable resistor to generate an appropriate analog output signal $V_{out}$ for each possible code value B.

The ladder of resistors can be used to generate $2^N$ different tap voltages. One of these tap voltages will be connected to the output by one of the tap switches, which is selected by the decoder logic. This ensures that each tap voltage is higher than the one beneath it. When the code value increases, the converted analog output also increases regardless of how good or bad the resistor matching is. As such, resistor-string D/A converters are guaranteed to be monotonic. This monotonicity is attractive in applications in which the D/A converters are used in a feedback loop.

Another advantage of resistor-string D/A converters is their low static-power consumption. The only required active components are the output buffer amplifier 102 and the reference voltage generators (i.e., the sources Of $V_{ref-hi}$ and $V_{ref-lo}$). Since the total resistance for the ladder of resistors could be very large (especially for large values of N), there is no need for current drivability of the reference voltage generators. Hence, they can consume very low power, which makes them suitable for portable applications.

The two main disadvantages of resistor-string D/A converters are their relatively low speed and large die area. Having a large resistor in their architecture makes them vulnerable to large RC time constants, which can decrease their speed. The worst case occurs when the code value corresponding to the mid-range voltage appears at the digital input. At that point, the capacitor $C_{equivalent}$ will see two parallel resistors each roughly of the size $2^{N-1}R$. Hence, the overall time constant would be $\tau = 2^{N-2}RC_{equivalent}$. Note that $C_{equivalent}$ consists not only of the op-amp input capacitance, but also the junction capacitances of the $2^N$ MOS switches. Since resistor-string D/A converters usually have fairly large time constants associated with them, they are usually used for high-resolution conversions with moderate speeds.

In an ideal resistor-string D/A converter, each resistor R has the exact same resistance value, and the analog output signals vary strictly linearly with the code values. In reality, however, the resistance values tend to vary from resistor to resistor, and, as a result, the D/A converter exhibits non-linear performance. It is also possible for one or more of the switches SWi to be defective. Two different measures are used to characterize the non-linearity of a resistor-string D/A converter: differential non-linearity (DNL) and integral non-linearity (INL). DNL refers to the deviation from the ideal for a single incremental step (i.e., from one code value to the next consecutive code value). INL refers to the cumulative deviation over a number of consecutive code values.

In order to thoroughly test a resistor-string D/A converter like converter 100 of FIG. 1, a conventional method would be to test each possible code value B, one step at a time, going from a minimum decimal code value of 0 to a maximum decimal code value of $(2^N-1)$ incrementing the code value by 1 for each successive step, where each step takes $T_{settle}$, where $T_{settle}$ is the worst-case D/A converter settling time. The thorough test is especially needed for DNL testing, where all the code values are examined. Such thorough testing can take a considerable time (at least $2^N T_{settle}$), which will add to the total cost of an integrated-circuit chip containing such a D/A converter.

FIG. 2 shows a schematic diagram of a conventional 4-bit D/A converter 200 having a folded resistor string. The folded resistor string is used to reduce the large parasitic capacitance otherwise present in D/A converters like converter 100 of FIG. 1. Using a folded resistor string also helps reduce the complexity of the decoders used to control the switches. The structure of D/A converter 200 is based on row-column addressing which is used extensively in memory designs. The total number of transistors on the output line is now $2(2^{N/2})$ due to the set of transistors connected directly to the output line and another set connected to the chosen bit line. Furthermore, the complexity of the decoder circuitry is dramatically reduced. However, the increase in speed is not quite so dramatic, since, when a word line goes high, all the bit lines must be pulled to the new voltage levels, not just the chosen bit line that gets connected to the output buffer.

SUMMARY OF THE INVENTION

The present invention is directed to an integrated circuit having a D/A converter, comprising (a) a plurality of resistors configured in a resistor string and adapted to receive two reference voltages; (b) a plurality of switches connected to the plurality of resistors; (c) decoder circuitry adapted to control the switches based on a code value to generate a corresponding tap voltage; (d) an output amplifier configured to generate an analog output voltage based on the tap voltage; (e) a normal-mode capacitor configured to an input of the output amplifier to reduce power consumption during normal-mode operation of the D/A converter; and (f) a test-mode capacitor switchably configured to the normal-mode capacitor to reduce settling time during test-mode operation of the D/A converter.

The present invention is also directed to a method for testing a D/A converter, comprising the steps of (a) applying a sequence of code values to the D/A converter, wherein the duration that each code value is applied to the D/A converter is a function of each code value; and (b) measuring an analog output voltage from the D/A converter after the corresponding duration for each code value.

The present invention is also directed to a method for testing a D/A converter, comprising the steps of (a) applying a sequence of non-consecutive code values to the D/A converter, wherein the duration that each code value is applied to the D/A converter corresponds to a partial settling time for the D/A converter; and (b) measuring an analog output voltage from the D/A converter after the corresponding duration for each code value.

BRIEF DESCRIPTION OF THE DRAWINGS

Other aspects, features, and advantages of the present invention will become more fully apparent from the following detailed description, the appended claims, and the accompanying drawings in which:

FIG. 4(a) shows a graphical representation of the duration of steps in conventional D/A converter testing, where each step is dictated by the worst-case (i.e., longest) settling time;

FIG. 4(b) shows a graphical representation of the actual converter settling times as they vary with code value; and FIGS. 5(a)–(b) show graphical representations of D/A converter testing procedures, according to another aspect of the present invention.

DETAILED DESCRIPTION

The present invention is directed to improvements to the design of and methods for testing resistor-string digital-to-analog converters. In one embodiment, a resistor-string D/A converter has a switched capacitor that is used to reduce the converter settling time during testing. In addition, the settling times vary as a function of the code value being tested, and the code values are selected in a non-consecutive order. Each of these features may be used independently or in any combination to accelerate converter testing as compared to conventional approaches to testing conventional converters.

Figure 2:
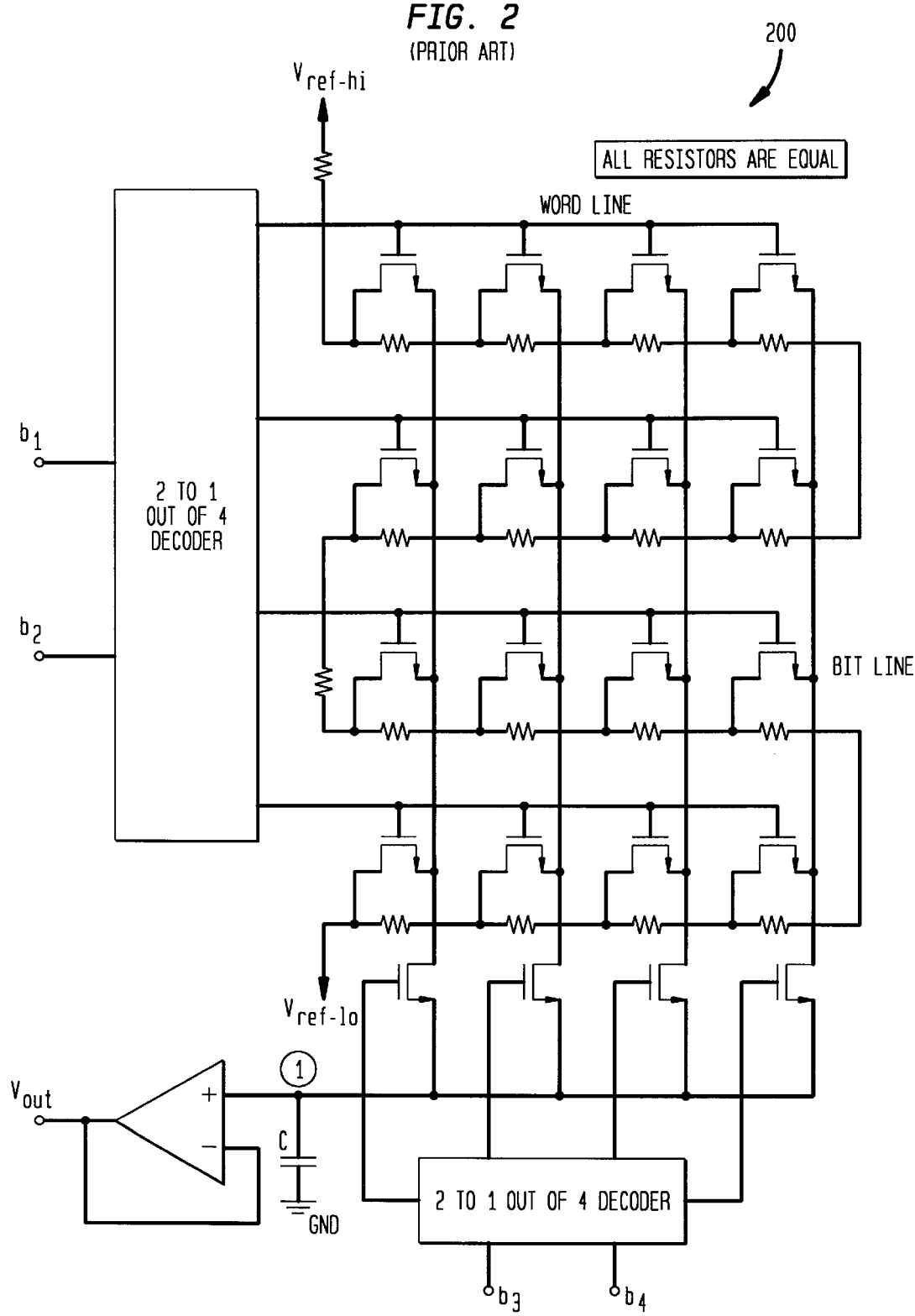
FIG. 2 shows a schematic diagram of a conventional folded-resistor-string D/A converter.
Figure 3:
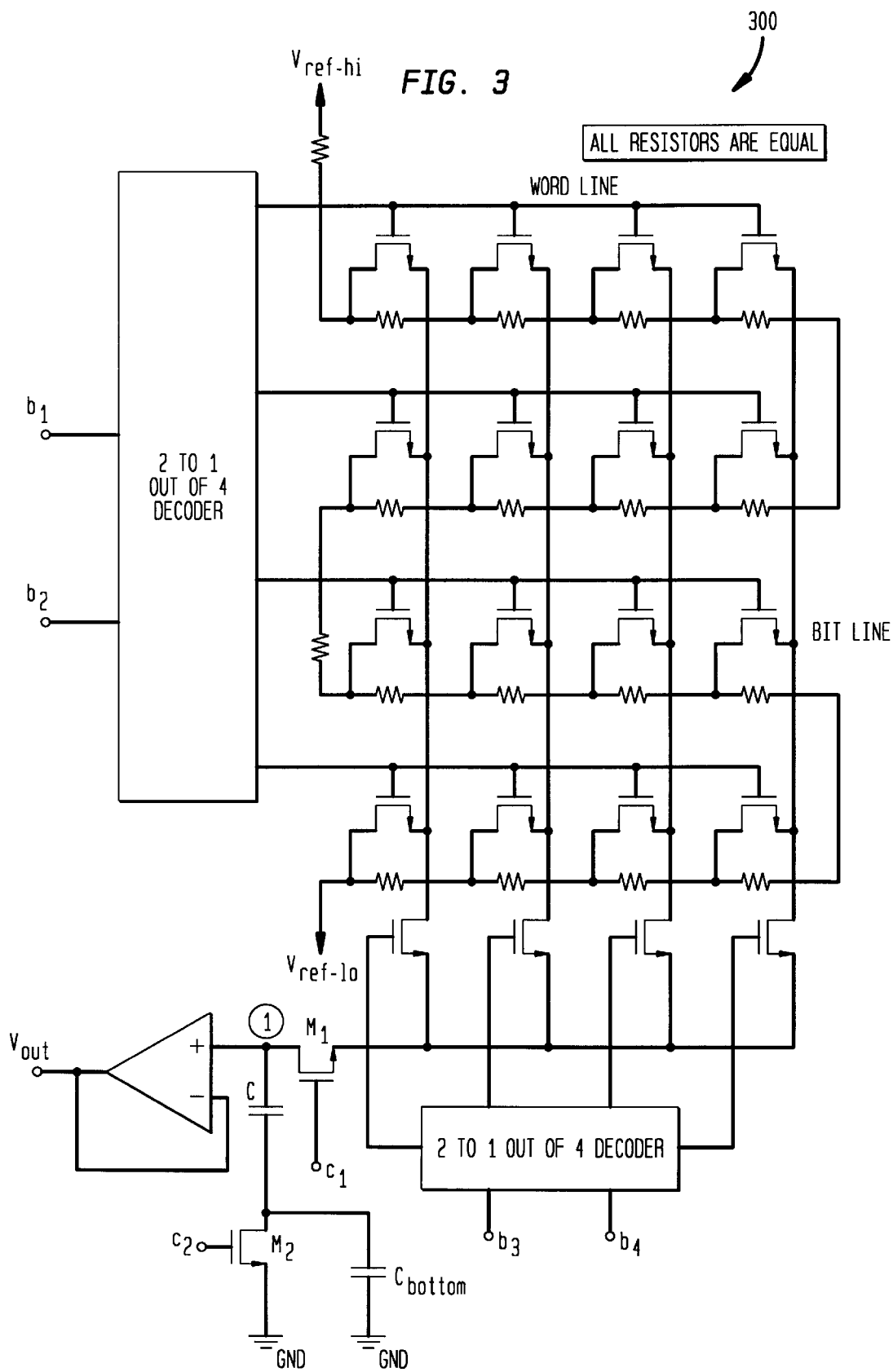
FIG. 3 shows a schematic diagram of a resistor-string D/A converter, according to one embodiment of the present invention.

FIG. 3 shows a schematic diagram of resistor-string D/A converter 300, according to one embodiment of the present invention. Like D/A converter 200 of FIG. 2, D/A converter 300 has a folded resistor string, simplified decoder circuitry, and an output amplifier. In addition, D/A converter 300 has capacitor $C_{bottom}$ and transistors $M_1$ and $M_2$, which are controlled by input signals $c_1$ and $c_2$, respectively.

Transistor $M_1$ can be used as a power-saving feature. Whenever the code value B is not changing, transistor $M_1$ can be turned off and the $V_{ref-hi}$ and $V_{ref-lo}$ reference voltage generators can be powered down. Only the output amplifier should be powered up in this mode of operation. The major design issue, in this case, is the switch leakage current. To minimize its impact, the largest possible value of C, which still meets the D/A converter settling time requirement, is chosen. As will be described later in this specification, during normal operations, transistor $M_2$ is left on.

As described in the background section, in order to thoroughly test a resistor-string D/A converter, the converter is tested with each of the possible code values. This specification describes different approaches to accelerate the testing of resistor-string D/A converters.

As shown in FIG. 3, D/A converter 300 includes transistor $M_2$ and capacitor $C_{bottom}$. As described above, capacitor C is chosen to be large in order to reduce the switch leakage current impact during low-power mode operation. During testing, switch leakage and power consumption are usually not of significant concern. The configuration of transistor $M_2$ and capacitor $C_{bottom}$ are included to accelerate testing. By turning off transistor $M_2$ during testing, capacitor $C_{bottom}$ becomes in series with capacitor C. Assuming that $C_{bottom}$ is one-tenth the size of C, the settling time would become about ten times smaller. In an alternative embodiment, transistor $M_2$ could be placed between node 1 and the top plate of capacitor C. In this embodiment, capacitor $C_{bottom}$ is shorted. One drawback in this alternative embodiment is an increase in the total leakage current due to an increase in the number of reverse-biased junctions hanging on node 1 in FIG. 3. Capacitor C can be any of the available capacitors in a certain technology, since non-linearity is of no consequence. In general, the smaller the value of $C_{bottom}/C$, the smaller the settling time for the D/A converter during testing, and the faster the test procedure. During normal operations, transistor $M_2$ is turned on, thereby effectively shorting out capacitor $C_{bottom}$.

As shown in FIG. 4(a), in conventional D/A converter testing, each step in the testing procedure is dictated by the worst-case (i.e., longest) settling time. As described in the background section, the longest settling time occurs at the mid code value, where the settling time is proportional to $2^{N-2}RC$. For other codes, the settling time is less.

FIG. 4(b) shows a graphical representation of the actual converter settling times as they vary with code value. As shown in FIG. 4(b), the settling time is greatest at the mid value and falls off as code values approach either the minimum value or the maximum value. According to a preferred embodiment of the present invention, the duration for each step in the testing procedure is a function of the code value being tested. Rather than have every step dictated by the worst-case, in this embodiment, the step durations are varied as the code values are varied. In this way, D/A converter testing can be accelerated. The total test time for the conventional approach is proportional to $(2^{2N}/4)RC$, whereas, for this code-dependent settling-time approach, the total test time is proportional to $(2^{2N}/6)RC$, a 33% saving.

Figure 1:
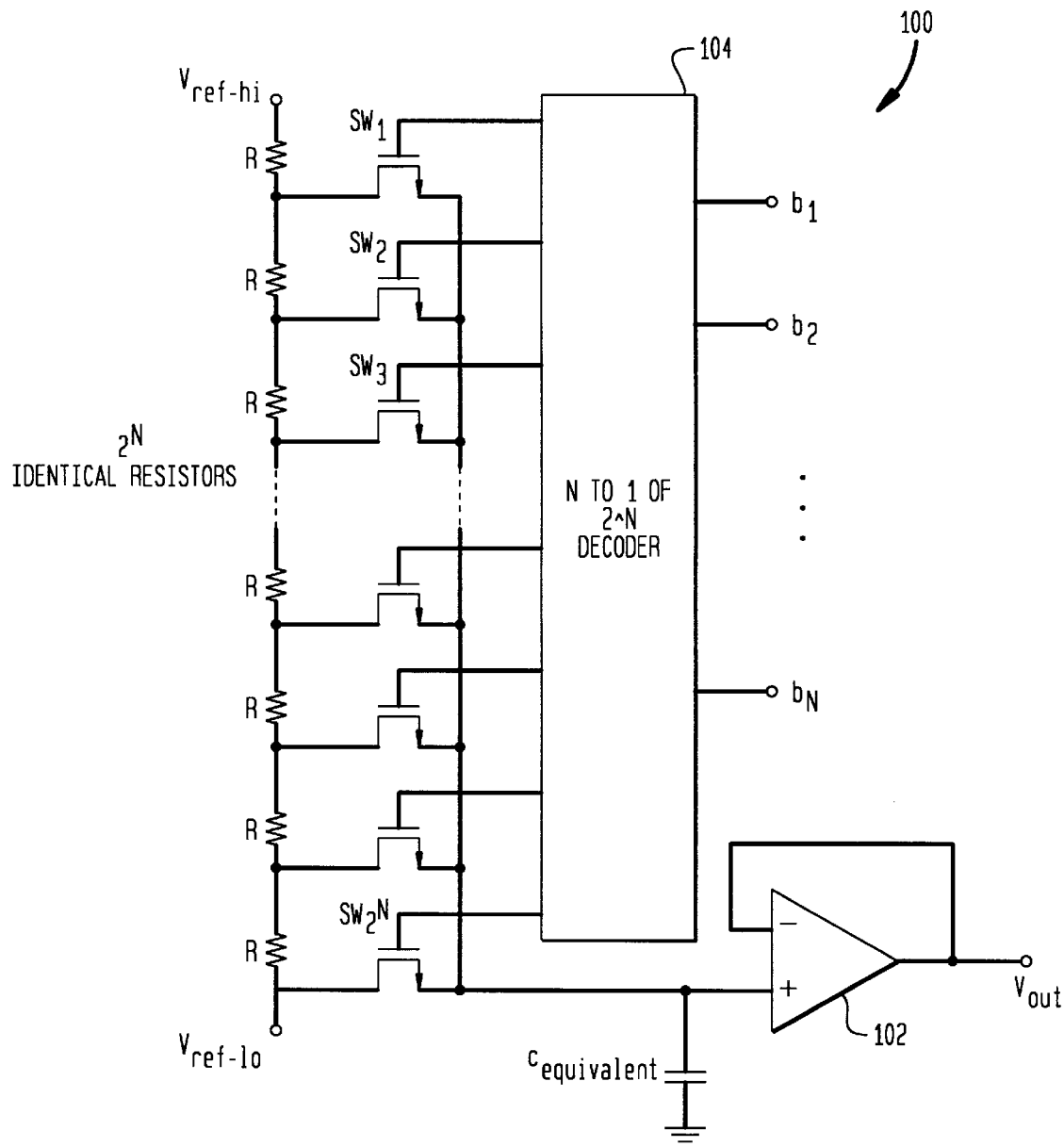
FIG. 1 shows a schematic diagram of a conventional linear-resistor-string D/A converter.

In certain designs and applications of D/A converters, it is more critical to test for the existence of defective switches than to measure the exact differential or integral non-linearities over the entire converter operating range. For example, in the linear-resistor-string D/A converter 100 of FIG. 1, the design is guaranteed to have a differential non-linearity within ±1 LSB, providing that there are no defective switches. If a DNL of ±1 LSB is acceptable (i.e., within the accuracy requirements for the converter application), then a testing approach that verifies that each switch is functional will be sufficient to guarantee that the DNL requirement is met.

There are two types of switch defects: stuck closed and stuck opened. If a switch is stuck closed, the DNL requirement (i.e., the non-linearity from step to step) may still be met. Nevertheless, depending on which switch is stuck closed, the total converter output signal range will be somewhat less than for a defect-free converter. For example, if switch $SW2_N$ is stuck closed, then the maximum output voltage $V_{out}$ (i.e., corresponding to switch SW1 being closed) will be approximately $(V_{ref-hi}+V_{ref-lo})/2$, instead of the ideal value of about $V_{ref-hi}$. Thus, although a stuck-closed switch does not necessarily cause a violation of a 1-LSB DNL requirement, it does change the output voltage range of the D/A converter. To a first-order approximation, the output swing may decrease by as much as a factor of two. If a switch is stuck opened, then that problem will be detected only when that specific switch is tested. If an attempt is made to close a defective stuck-open switch, then the output will either float (i.e., drift slowly over time) or stay at the previous level.

The conventional method for testing D/A converters requires selecting each switch sequentially and waiting for the output to settle completely. There are often substantial switching transients and, if the output loading capacitance is large, settling can take a long time, making the total test time significantly costly. To determine whether a switch is closing properly, it is not necessary to wait until the output is fully settled, as long as it can be verified that the switch is conducting when switched. If the switches are tested sequentially, however, since the output voltages for consecutive code values differ by the equivalent of 1 LSB, it may be hard to determine whether one switch has opened and the other has closed without waiting for the transients to settle.

In another aspect of the present invention, testing is performed by purposely selecting switches that are far apart from one another for consecutive testing steps, as shown, for example, in FIGS. 5(a)–(b). In FIG. 5(a), assuming a 12-bit D/A converter, the first code value tested is the max value 4095, the second code value is the mid value 2047, the third code value is 4094, the fourth code value is 2046, etc., until the last code values 2048 and 0 are tested. In the testing procedure of FIG. 5(b), the code values from 4095 to 2048 are tested, interleaved by code value 0, during the first half of testing. During the second half of testing, the code values 0 to 2047 are tested, interleaved by code value 4095. In each of these testing procedures, each pair of consecutive testing steps is performed on non-consecutive code values of significantly different magnitudes. As a result, in a defect-free converter, the output voltages will vary significantly from step to step. As long as a significant voltage change is detected, the switch corresponding to the new code value will be assured of having been closed. Because the expected voltage change is relatively large, as long as a significant voltage change is detected, it is not necessary to wait until the new output voltage is fully settled. As a result, only partial settling is required, since the goal is to verify whether or not a switch is functional. A comparison to a variable threshold voltage (shown as dashed lines in FIGS. 5(a)–(b)) is all that is required to confirm that each switch is properly operational. This should provide a substantial improvement in testing time, since the D/A converter can be switched at a higher rate between test steps.

In principle, testing procedures, such as those shown in FIGS. 5(a)–(b), can be done with an A/D converter with input range somewhat less than the D/A converter output swing—which might permit the use of an on-chip fast A/D converter for rapid testing of the D/A converter switch integrity. In conventional testing of D/A converter linearity, the D/A converter output wave form is digitized and the results analyzed. Under the testing of the present invention, this is not required. Rather, each code change can be tested as a logic change on a digital pin. By testing with a digital channel, the results are analyzed "on the fly." No time is used other than what is required for the data to partially settle and the capture to take place. In fact, the resistor-string D/A converter DNL test does not require a mixed-signal tester.

The different approaches to D/A converter testing disclosed in this specification can be applied in different combinations and to different types of D/A converters. For example, the three approaches—the switched-test-capacitor approach of FIG. 3, the code-dependent settling-time approach of FIG. 4(b), and the non-consecutive-code-value approach of FIGS. 5(a)–(b)—can be applied in any combination of one, two, or all three approaches to test a D/A converter such as converter 300 of FIG. 3. In addition, the code-dependent settling-time approach of FIG. 4(b) can be applied to test a D/A converter, such as converter 100 of FIG. 1 or converter 200 of FIG. 2, either with or without the non-consecutive-code-value approach of FIGS. 5(a)–(b). The switched-capacitor approach can be applied to either linear-resistor-string or folded-resistor-string D/A converters.

These approaches can also be applied to D/A converters other than resistor-string D/A converters. In general, any of the approaches can be applied to any (pure or mixed) thermometer-coded-based D/A converter, which includes resistor-string D/A converters.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. An integrated circuit having a D/A converter, comprising:
   (a) a plurality of resistors configured in a resistor string and adapted to receive two reference voltages;
   (b) a plurality of switches connected to the plurality of resistors;
   (c) decoder circuitry adapted to control the switches based on a code value to generate a corresponding tap voltage;
   (d) an output amplifier configured to generate an analog output voltage based on the tap voltage;
   (e) a normal-mode capacitor coupled to an input of the output amplifier to reduce power consumption during normal-mode operation of the D/A converter; and
   (f) a test-mode capacitor switchably coupled to the normal-mode capacitor to reduce settling time during test-mode operation of the D/A converter.

2. The invention of claim 1, wherein the resistor string is a folded resistor string or a linear resistor string.

3. The invention of claim 1, further comprising a switch transistor configured to control the configuration of the test-mode capacitor between test-mode operation and normal-mode operation.

4. The invention of claim 1, further comprising a power-saving transistor configured to isolate the signal stored in the normal-mode capacitor during normal-mode operation to permit powering down of the two reference voltages when the code value does not change.

5. The invention of claim 1, wherein the size of the normal-mode capacitor is greater than the size of the test-mode capacitor.

6. The invention of claim 1, wherein, during test-mode operation, the duration of each test step is a function of the code value.

7. The invention of claim 1, wherein, during test-mode operation, non-consecutive code values are used for consecutive test steps and the duration of each test step corresponds to a partial settling time for the D/A converter.

8. The invention of claim 7, wherein, during test-mode operation, the duration of each test step is a function of the code value.

9. The invention of claim 8, wherein:
   the resistor string is a folded resistor string or a linear resistor string; and further comprising:
      a switch transistor configured to control the configuration of the test-mode capacitor between test-mode operation and normal-mode operation; and a power-saving transistor configured to isolate the signal stored in the normal-mode capacitor during normal-mode operation to permit powering down of the two reference voltages when the code value does not change, wherein the size of the normal-mode capacitor is greater than the size of the test-mode capacitor.

10. A method for testing a D/A converter, comprising the steps of:

(a) applying a sequence of code values to the D/A converter, wherein the duration that each code value is applied to the D/A converter is a function of each code value and the duration is independent of the output signal generated by the D/A converter; and (b) measuring an analog output voltage from the D/A converter after the corresponding duration for each code value.

11. The invention of claim 10, wherein the sequence of code values corresponds to non-consecutive code values.

12. The invention of claim 10, wherein the duration that each code value is applied to the D/A converter corresponds to a partial settling time for the D/A converter.

13. The invention of claim 10, wherein step (b) comprises the step of comparing the analog output voltage to a variable voltage threshold value.

14. A method for testing a D/A converter, comprising the steps of:

(a) applying a sequence of non-consecutive code values to the D/A converter, wherein the duration that each code value is applied to the D/A converter corresponds to a partial settling time for the D/A converter; and (b) measuring an analog output voltage from the D/A converter after the corresponding duration for each code value.

15. The invention of claim 14, wherein step (b) comprises the step of comparing the analog output voltage to a variable voltage threshold value.

16. The invention of claim 14, wherein the duration that each code value is applied to the D/A converter is a function of each code value.

17. The invention of claim 14, wherein the duration that each code value is applied to the D/A converter is a function of each code value and is independent of the output signal generated by the D/A converter.

* * * * *